US006975547B2

(12) United States Patent
Byeon et al.

(10) Patent No.: US 6,975,547 B2
(45) Date of Patent: Dec. 13, 2005

(54) FLASH MEMORY DEVICES THAT SUPPORT EFFICIENT MEMORY LOCKING OPERATIONS AND METHODS OF OPERATING FLASH MEMORY DEVICES

(75) Inventors: Dae Seok Byeon, Kyungki-do (KR); Seung-Jae Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 34 days.

(21) Appl. No.: 10/820,245

(22) Filed: Apr. 6, 2004

(65) Prior Publication Data

US 2004/0257883 A1 Dec. 23, 2004

(30) Foreign Application Priority Data

Jun. 17, 2003 (KR) ...................... 10-2003-0039127

(51) Int. Cl.[7] ............................................. G11C 7/00
(52) U.S. Cl. ............ 365/195; 365/189.05; 365/189.07; 365/189.12
(58) Field of Search .......................... 365/195, 189.07, 365/189.05, 189.12

(56) References Cited

U.S. PATENT DOCUMENTS

| 5,197,034 | A | 3/1993 | Fandrich et al. |
| 5,345,413 | A | 9/1994 | Fisher et al. |
| 5,363,334 | A | 11/1994 | Alexander et al. |
| 5,513,136 | A | 4/1996 | Fandrich et al. |
| 6,031,757 | A | 2/2000 | Chuang et al. |
| 6,209,069 | B1 | 3/2001 | Baltar |
| 6,549,482 | B2 * | 4/2003 | Garner .................. 365/230.03 |

FOREIGN PATENT DOCUMENTS

| JP | 6-175917 | 6/1994 |
| JP | 6-324938 | 11/1994 |
| JP | 11-120781 | 4/1999 |

OTHER PUBLICATIONS

U.S. Appl. No. 10/417,770, Filed Apr. 17, 2003, entitled "Devices Establishing Write-Protection Blocks in Non-Volatile Semiconductor Memory Device,".
Office Action, Korean Application No. 10-2003-0053754, Aug. 24, 2004.
Notice to Submit Response, Korean Application No. 10-2003-0039127, Jun. 23, 2005.

* cited by examiner

Primary Examiner—Anh Phung
Assistant Examiner—Pho M. Luu
(74) Attorney, Agent, or Firm—Myers Bigel Sibley & Sajovec PA

(57) ABSTRACT

Flash memory devices include at least one flash memory array and an address compare circuit that is configured to indicate whether an applied row address associated with a first operation (e.g., program, erase) is within or without an unlock area of the at least one flash memory array. A control circuit is also provided. This control circuit is configured to block performance of the first operation on the flash memory array in response to detecting an indication from the address compare circuit that the applied row address is outside the unlock area of the flash memory array.

24 Claims, 9 Drawing Sheets

FLASH MEMORY DEVICES THAT SUPPORT EFFICIENT MEMORY LOCKING OPERATIONS AND METHODS OF OPERATING FLASH MEMORY DEVICES

REFERENCE TO PRIORITY APPLICATION

This application claims priority to Korean Application Serial No. 2003-39127, filed Jun. 17, 2003, the disclosure of which is hereby incorporated herein by reference.

FIELD OF THE INVENTION

The present invention relates to integrated circuit memory devices and, more particularly, to flash memory devices and methods of operating flash memory devices.

BACKGROUND OF THE INVENTION

Flash memory devices represent one type of nonvolatile memory that typically utilize arrays of EEPROM cells. In particular, a flash memory is a form of EEPROM technology that allows multiple memory locations to be erased or programmed in one programming operation. Normal EEPROM typically only allows one location at a time to be erased or programmed, which means that flash memories can operate at higher effective speeds when the systems using them read and write to different locations at the same time. Flash memory is typically made in two forms: NOR-based flash and NAND-based flash. The names NOR and NAND refer to the type of logic gate used in each storage cell. NOR-based flash was the first type to be developed. It has relatively long erase and write times, but has a full address/data interface that allows random access to any location. This makes it suitable for storage of program code, which only needs to be infrequently updated. NOR-based flash may have an endurance in a range between 10,000 and 100,000 erase cycles. NOR-based flash was the basis for early flash-based removable media, including both Compact Flash and Smart Media. In contrast, NAND-based flash typically has faster erase and write (i.e., program) times, higher density and lower cost per bit than NOR-based flash and much greater endurance. However, its I/O interface typically only allows for sequential data access. This makes it suitable for mass-storage devices such as PC cards. NAND-based flash has led to several small media formats, including MMC, Secure Digital and Memory Stick. NAND-based flash forms the core of the removable USB interface storage known as key drives.

Flash and other nonvolatile memory devices have also been developed with write protection features that reduce the likelihood of mistakenly erasing or overwriting data to be protected. Examples of nonvolatile memory devices having write protection are disclosed in U.S. Pat. No. 6,031,757 to Chuang et al., U.S. Pat. No. 5,513,136 to Fandrich et al. and U.S. Pat. No. 5,197,034 to Fandrich et al. Unfortunately, conventional write protection techniques typically require locking one or more fixed sized blocks within a memory array and/or the use of additional external pins to control the locking operations. Thus, notwithstanding these conventional nonvolatile memory devices, there continues to be a need for improved nonvolatile memory devices having flexible write protection characteristics that do require the use of additional pins or limit protection to fixed sized blocks.

SUMMARY OF THE INVENTION

Flash memory devices according to embodiments of the present invention include at least one flash memory array and an address compare circuit that is configured to indicate whether an applied address associated with a first operation (e.g., program, erase) is within or without an unlock area of the at least one flash memory array. A control circuit is also provided. This control circuit is configured to block performance of the first operation on the flash memory array in response to detecting an indication from the address compare circuit that the applied address is outside the unlock area of the flash memory array. The address compare circuit may include a start address register that is configured to latch an applied start address in-sync with a start clock signal and an end address register that is configured to latch an applied end address in-sync with an end clock signal. The address compare circuit may also include a start address comparator that is configured to receive a latched start address from the start address register and an end address comparator that is configured to receive a latched end address from the end address register. Boolean logic may also be provided at the outputs of the start and end address comparators. This boolean logic may be configured to generate an unlock signal that indicates whether the applied address associated with the first operation is within or without the unlock area of the flash memory array. This unlock signal may be provided to the control circuit, which undertakes to block the command if the value of the unlock signal identifies the applied address as being outside the unlock area.

Still further embodiments of the present invention include a flash memory device having at least one flash memory array therein, a word line control circuit that is electrically coupled to word lines in the flash memory array and a bit line control circuit that is electrically coupled to bit lines in the flash memory array. The word line and bit line control circuits are responsive to a command control signal (e.g., CTL). An address compare circuit is also provided. This compare circuit is configured to indicate whether an applied row address associated with a program or erase command is within or without an unlock area of the flash memory array. The boundaries of this unlock area may be specified by start and end addresses that point to rows within the flash memory array. These start and end addresses may be stored in registers within the compare circuit. The compare circuit may indicate whether the applied row address is within or without the unlock area by generating an unlock signal at an active level if the applied row address is within the unlock area or at an inactive level if the applied row address is without the unlock area.

This unlock signal and the command are provided to a primary control circuit, which is configured to generate a command enable signal in response to the command and the unlock signal. This command enable signal may be a program enable signal if the command is a program command or an erase enable signal if the command is an erase command. The command enable signal is provided to a corresponding command control circuit, which is configured to generate the command control signal in response to the command enable signal. This command control signal may be provided to the bit line and word line control circuits, and may operate to "lock" these circuits when active.

According to further aspects of these embodiments, the primary control circuit may be responsive to an address input pulse signal (AIP), which may be received at a pin of the flash memory device. The flash memory device may also include an address port that is narrower than the full width of an applied address. In this case, the flash memory device may be configured to latch first and second portions of the applied row address in-sync with first and second consecutive leading edges of the address input pulse signal.

The address compare circuit may also include separate start and end address registers. The start address register may be configured to latch an applied start address in-sync with a start clock signal and the end address register may be configured to latch an applied end address in-sync with an end clock signal. These start and end clock signals may be generated by the primary control circuit. In particular, the primary control circuit may be configured to generate the start clock signal in response to a first sequence of address input pulses and further generate the end clock signal in response to a second sequence of address input pulses.

Still further embodiments of the present invention include methods of operating flash memory devices. These methods may include loading a start and end addresses associated with an unlock area of a flash memory array into the flash memory device, in response to power-up and/or reset operations. Then, during normal mode operation, an applied address associated with an erase or program command is loaded into the flash memory device. The applied address is compared to the start address to determine whether the applied address is greater than or equal to the start address. The applied address is also compared to the end address to determine whether the applied address is less than or equal to the end address. An unlock signal may then be generated at an active level in response to determining that the applied address is greater than or equal to the start address and less than or equal to the end address.

DETAILED DESCRIPTION OF PREFERRED EMBODIMENTS

Figure 1:
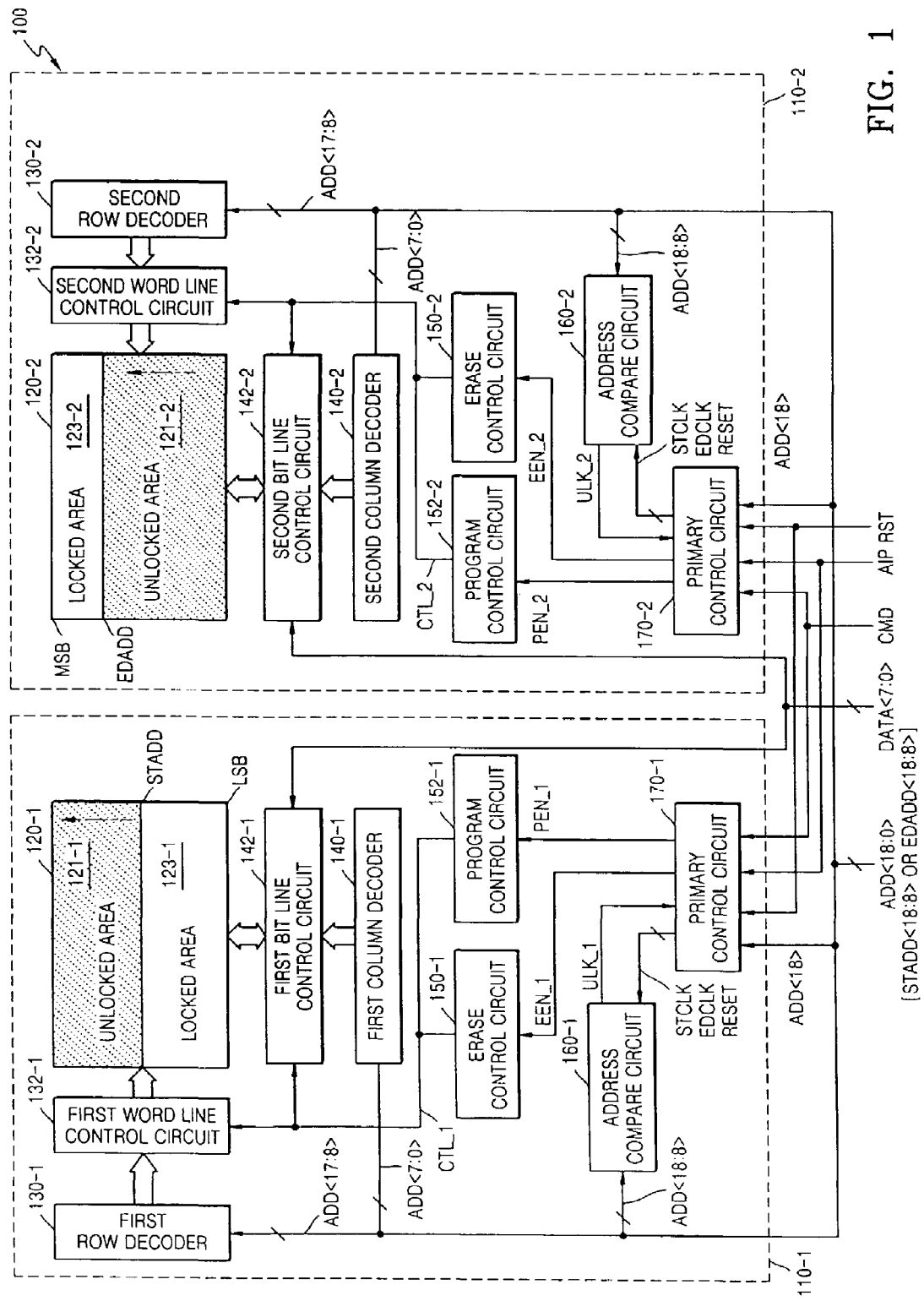
FIG. 1 is a block diagram of a flash memory device system according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Referring now to FIG. 1, a flash memory device system 100 according to an embodiment of the present invention is illustrated as including first and second flash memory devices 110-1 and 110-2, respectively. Each of these flash memory devices may be formed on a respective integrated circuit substrate (e.g., semiconductor chip) and each substrate may be mounted in a respective integrated circuit package. Alternatively, multiple substrates may be mounted side-by-side in a single integrated circuit package (not shown) to define a single high capacity flash memory device. Each of the flash memory devices 110-1 and 110-2 may be operated independently or in combination with another flash memory device(s), as shown.

The first flash memory device 110-1 includes a first flash memory array 120-1. This first flash memory array 120-1 may be configured to support multiple rows and multiple columns of flash memory cells in a conventional manner. Each of the rows of flash memory cells may be electrically connected to a respective word line and each of the columns of flash memory cells may be electrically connected to a respective bit line(s). The word lines within the first flash memory array 120-1 receive word line signals from a first word line control circuit 132-1, which may include word line driver circuitry, and a first row decoder 130-1, which is responsive to a row address (shown as ADD<17:8>). The bit lines within the first flash memory array 120-1 supply read data to and receive write data from a first bit line control circuit 142-1, which is electrically coupled to a first column decoder 140-1. The first column decoder 140-1 is responsive to a column segment address (shown as ADD<7:0>). The write data and read data is provided to and from the first bit line control circuit 142-1 via a bidirectional data bus DATA<7:0>. The word line control circuit 132-1, row decoder 130-1, bit line control circuit 142-1 and column decoder 140-1 may be of conventional design and need not be described further herein.

The first flash memory array 120-1 may be configured into an active region(s) that may be programmed (i.e., written to) and erased in response to program and erase commands, respectively, and an inactive region(s) that is not subject to programming and/or erase operations. The active region(s) is described herein as an unlocked area 121-1 and the inactive region is described herein as a locked area 123-1. Each of these areas 121-1 and 123-1 may include a respective plurality of rows of flash memory cells, which define one or more contiguous block of rows within the first flash memory array 120-1. In the first flash memory array 120-1, the locked area 123-1 is illustrated as extending from row 0 (LSB address) to an intermediate row. This intermediate row is shown as the row corresponding to a start row address (STADD<17:8>) minus one (i.e., intermediate row= (STADD<17:8>−1b), where "b" designates binary notation and STADD<18>=0b). The unlocked area 121-1 is illustrated as extending from the start row address (STADD<17:8>) to a row defined by an end row address (EDADD<17:8>, where EDADD<18>=0b). Thus, in the illustrated embodiment, the first flash memory array 120-1 is illustrated as having $2^{10}$ addressable rows of flash memory cells that are segmented into $2^8$ segments at 8-bits/segment, which means the first flash memory array 120-1 is illustrated as having $2^{11}$ columns of flash memory cells.

As described more fully hereinbelow with respect to FIG. 2, the values of the start and end row addresses may be programmed into corresponding registers within the first flash memory device 110-1. Moreover, in some applications, as the one illustrated, the end row address EDADD may correspond to the last addressable row of flash memory cells within the first flash memory array 120-1 (e.g., EDADD<18: 8> may equal 01111111111). Setting the end row address EDADD to the last address within the first flash memory array 120-1 may be useful when the unlocked area 121-1 is supposed to define a block of rows of flash memory cells that spans multiple flash memory arrays, without interruption by one or more blocks of rows that define locked areas.

The second flash memory device 110-2 is configured in a similar manner to the first flash memory device 110-1. In particular, the second flash memory device 110-2 includes a second flash memory array 120-2, which may have the same capacity as the first flash memory array 120-1. The word lines within the second flash memory array 120-2 receive word line signals from a second word line control circuit 132-2 and a second row decoder 130-2, which is responsive to a row address (shown as ADD<17:8>). The bit lines within the second flash memory array 120-2 supply read data to and receive write data from a second bit line control circuit 142-2, which is electrically coupled to a second column decoder 140-2. The second column decoder 140-2 is responsive to a column segment address (shown as ADD<7:0>). The write data and read data is provided to and from the second bit line control circuit 142-2 via the bidirectional data bus DATA<7:0>. This data bus is shared by the first and second flash memory devices 110-1 and 110-2.

The 19-bit address ADD<18:0> may be provided as a plurality of address bytes (e.g., 8-bit bytes) that are sequentially loaded onto an address bus that is electrically connected to the first and second flash memory devices 110-1 and 110-2. This 19-bit address may represent a start address (STADD) or an end address (EDADD) when the first and second flash memory devices 110-1 and 110-2 are being initialized. Thereafter, the 19-bit address may be used to identify a particular row address and column segment address during program, erase and read operations. The most significant bit of the 19-bit address (i.e., ADD<18>) operates as a chip select signal, which specifies whether the first or second flash memory device is being addressed in response to a respective command or other control signal. In the illustrated flash memory device system 100, the first flash memory device 110-1 is associated with the memory space defined by the following first addresses: 000 . . . 0000≦ADD<18:0>≦011 . . . 1111; and the second memory device 110-2 is associated with the memory space defined by the following second addresses: 100 . . . 0000≦ADD<18:0>≦111 . . . 1111.

The second flash memory array 120-2 may be configured to support an active region(s) that may be programmed (i.e., written to) and erased in response to program and erase commands (CMD), respectively, and an inactive region(s) that is not subject to programming and/or erase operations. The active region is described herein as the unlocked area 121-2 and the inactive region is described herein as the locked area 123-2. Each of these areas 121-2 and 123-2 may include a respective plurality of rows of flash memory cells.

The unlocked area 121-2 is illustrated as extending from row 0 (STADD<17:8>=000 . . . 000) to an intermediate row, which is shown as the row corresponding to an end row address (EDADD<17:8>, where EDADD<18>=1b). The locked area 123-2 is illustrated as extending from the next row following the end row address to a last physical row address within the second flash memory array 120-2. By having the unlocked areas within the first and second flash memory arrays 120-1 and 120-2 span an address space from STADD<18:0>=0XXX . . . XXX to EDADD<18:0>= 0111 . . . 111 in the first flash memory array 120-1 and STADD<18:0>=1000 . . . 000 to EDADD<18:0>= 1XXX . . . XXX in the second flash memory array 120-1, an uninterrupted address space may be defined that spans the first and second flash memory arrays 120-1 and 120-2. Alternative address space configurations are also possible within each flash memory array. For example, multiple start and end addresses may be utilized within each flash memory device 110-1 and 110-2 to define multiple active blocks and multiple inactive blocks within each flash memory array.

The first flash memory device 110-1 also includes an address compare circuit 160-1 and a first control circuit. The first control circuit is illustrated as including a primary control circuit 170-1, an erase control circuit 150-1 and a program control circuit 152-1. As illustrated and described more fully with respect to FIG. 2, the address compare circuit 160-1 is responsive to a most significant portion of a received address, which is shown as ADD<18:8>, and a plurality of control signals generated by the primary control circuit 170-1. These control signals include a "start" clock signal (STCLK), an "end" clock signal (EDCLK) and a reset signal (RESET). The address compare circuit 160-1 is also configured to generate an unlock signal ULK_1, which specifies whether or not a received row address ADD<17:8> designates a row within an unlocked area 121-1 of the first flash memory array 120-1. The primary control circuit 170-1 is responsive to a chip select signal, shown as ADD<18>, a reset signal RST, a command signal CMD, an address input pulse signal AIP and the unlock signal ULK_1. The value of the chip select signal ADD<18> determines whether the first flash memory device 110-1 or the second flash memory device 110-2 is being addressed by an applied command signal.

The primary control circuit 170-1 is configured to generate the start clock signal STCLK, the end clock signal EDCLK and the reset signal RESET, which are provided to the address compare circuit 160-1. The primary control circuit 170-1 is also configured to generate an erase enable signal EEN_1 or a program enable signal PEN_1 that takes into account the value of the unlock signal ULK_1. In particular, if a program operation is requested by the command signal CMD and the unlock signal ULK_1 is generated at an active high level, then the program enable signal PEN_1 will be generated at an active level to thereby enable a program operation in the unlocked area 121-1. Similarly, if an erase operation is requested by the command signal CMD and the unlock signal ULK_1 is generated at an active high level, then the erase enable signal EEN_1 will be generated at an active level to thereby enable an erase operation in the unlocked area 121-1. The erase control circuit 150-1 is configured to generate a control signal CTL_1 at an active level in response to an active erase enable signal EEN_1. Likewise, the program control circuit 152-1 is configured to generate a control signal CTL_1 at an active level in response to an active program enable signal PEN_1. This active control signal CTL_1 operates to enable the word line control circuit 132-1 and the bit line control circuit 142-1.

Similarly, the second flash memory device 110-2 includes an address compare circuit 160-2 and a second control circuit. The second control circuit is illustrated as including a primary control circuit 170-2, an erase control circuit 150-2 and a program control circuit 152-2. As illustrated and described more fully with respect to FIG. 2, the address compare circuit 160-2 is responsive to a most significant portion of a received address, which is shown as ADD<18:8>, and a plurality of corresponding control signals (STCLK, EDCLK and RESET), where are generated by the primary control circuit 170-2. The address compare circuit 160-2 is also configured to generate an unlock signal ULK_2, which specifies whether or not a received row address ADD<17:8> designates a row within an unlocked area 121-2 of the second flash memory array 120-2. The primary control circuit 170-2 is responsive to the chip select signal ADD<18>, the reset signal RST, the command signal CMD, the address input pulse signal AIP and the unlock signal ULK_2. The primary control circuit 170-2 is configured to generate the corresponding start clock signal STCLK, the end clock signal EDCLK and the reset signal RESET, which are provided to the address compare circuit 160-2. The primary control circuit 170-2 is also configured to generate an erase enable signal EEN_2 or a program enable signal PEN_2 that takes into account the value of the unlock signal ULK_2. In particular, if a program operation is requested by the command signal CMD and the unlock signal ULK_2 is generated at an active high level, then the program enable signal PEN_2 will be generated at an active level to thereby enable a program operation in the unlocked area 121-2. Similarly, if an erase operation is requested by the command signal CMD and the unlock signal ULK_2 is generated at an active high level, then the erase enable signal EEN_2 will be generated at an active level to thereby enable an erase operation in the unlocked area 121-2. The erase control circuit 150-2 is configured to generate a control signal CTL_2 at an active level in response to an active erase enable signal EEN_2. Likewise, the program control circuit 152-2 is configured to generate a control signal CTL_2 at an active level in response to an active program enable signal PEN_2. This active control signal CTL_2 operates to enable the word line control circuit 132-2 and the bit line control circuit 142-2.

Figure 2:
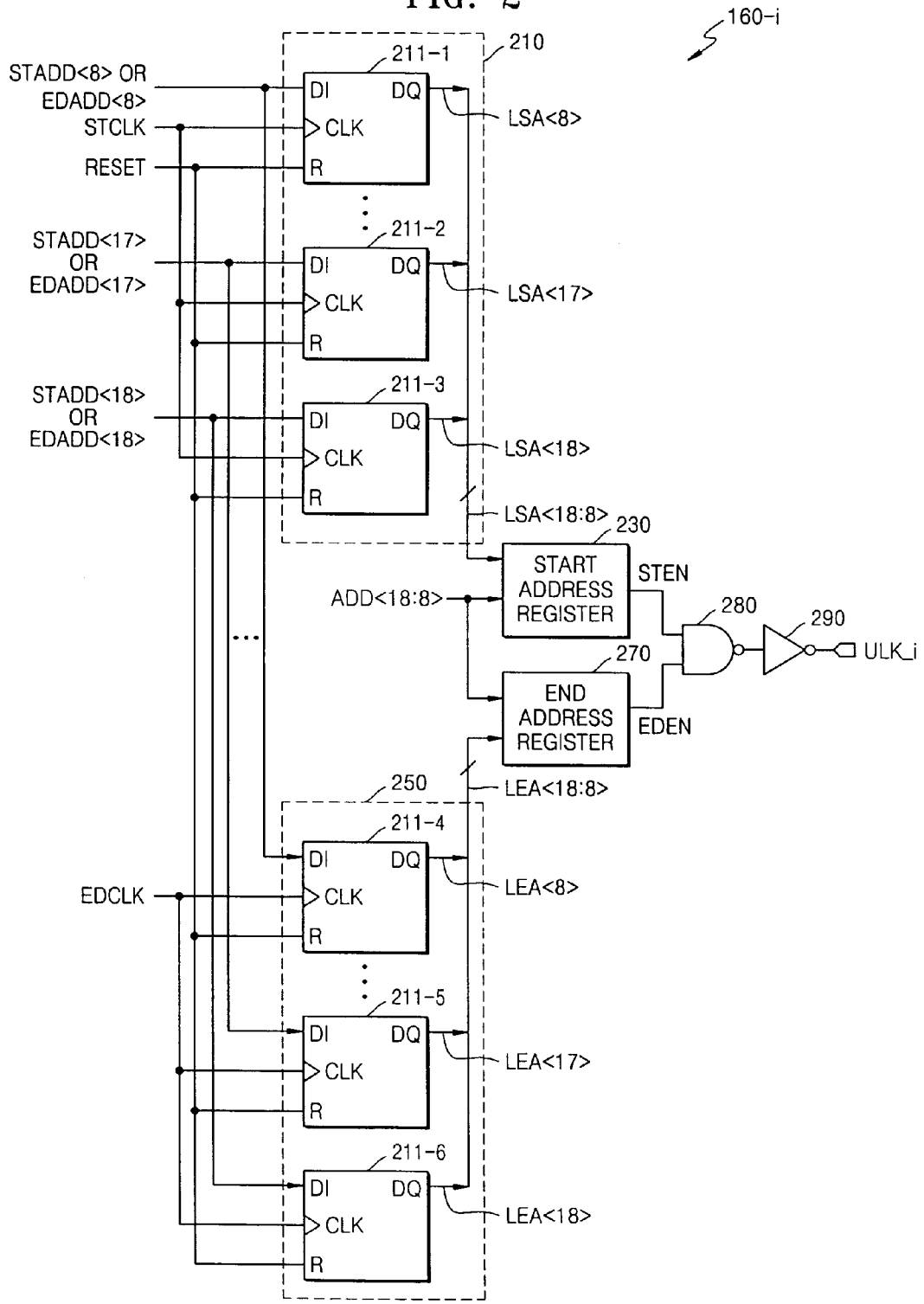
FIG. 2 is an electrical schematic of an address compare circuit that may be utilized in the flash memory device system of FIG. 1.

The address compare circuits 160-1 and 160-2 within the first and second flash memory devices 110-1 and 110-2 may be configured as illustrated by FIG. 2. In particular, FIG. 2 illustrates an address compare circuit 160-i that includes a start address register 210 and an end address register 250. The start address register 210 comprises a plurality of D-type flip-flops (211-1, 211-2, . . . , 211-3) that are configured to generate a latched start address LSA<18:8> in response to a supplied start address STADD<18:8>. The start address register 210 is responsive to an active high start clock signal STCLK and an active high reset signal RESET. The end address register 250 comprises a plurality of D-type flip-flops (211-4, 211-5, . . . , 211-6) that are configured to generate a latched end address LEA<18:8> in response to a supplied end address EDADD<18:8>. The end address register 250 is responsive to an active high end clock signal EDCLK and an active high reset signal RESET.

The latched start address LSA<18:8> and a supplied row address ADD<18:8> are provided as inputs to a first address compare circuit 230. The first address compare circuit 230 is configured to generate a start enable signal STEN at an active high level whenever the supplied row address ADD<18:8> is greater than or equal to the latched start address LSA<18:8>. Similarly, the latched end address LEA<18:8> and the supplied row address ADD<18:8> are provided as inputs to a second address compare circuit 270. The second address compare circuit 270 is configured to generate an end enable signal EDEN at an active high level whenever the supplied row address ADD<18:8> is less than or equal to the latched end address LEA<18:8>.

Figure 8:
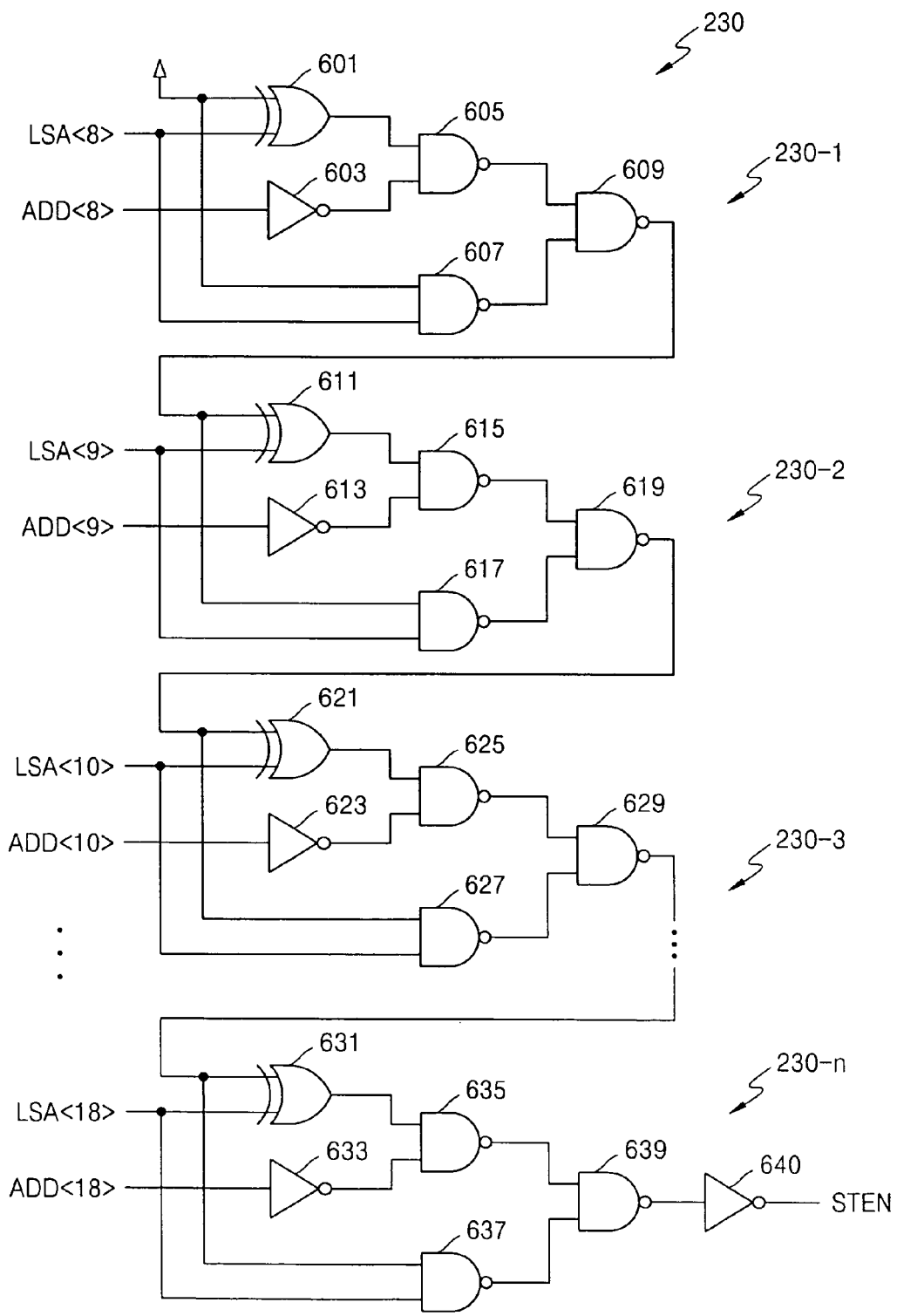
FIG. 8 is an electrical schematic of a first address comparator that may be used in the address compare circuit of FIG. 2.

An exemplary embodiment of the first address compare circuit 230 is illustrated as including a plurality of stages, which are shown as 230-1 through 230-N in FIG. 8. Each of these stages performs a bit-to-bit comparison between a latched start address bit and a corresponding bit of an applied address and also receives a result signal from a prior stage. The first stage 230-1 is illustrated as including an exclusive-OR logic gate 601, an inverter 603 and NAND gates 605, 607 and 609. The second stage 230-2 is illustrated as including an exclusive-OR logic gate 611, an inverter 613 and NAND gates 615, 617 and 619. The third stage 230-3 is illustrated as including an exclusive-OR logic gate 621, an inverter 623 and NAND gates 625, 627 and 629. The last stage 230-n is illustrated as including an exclusive-OR logic gate 631, an inverter 633, NAND gates 635, 637 and 639 and an output inverter 640 what converts an active low signal at an output of the NAND gate 639 to an active high start enable signal STEN.

Figure 9:
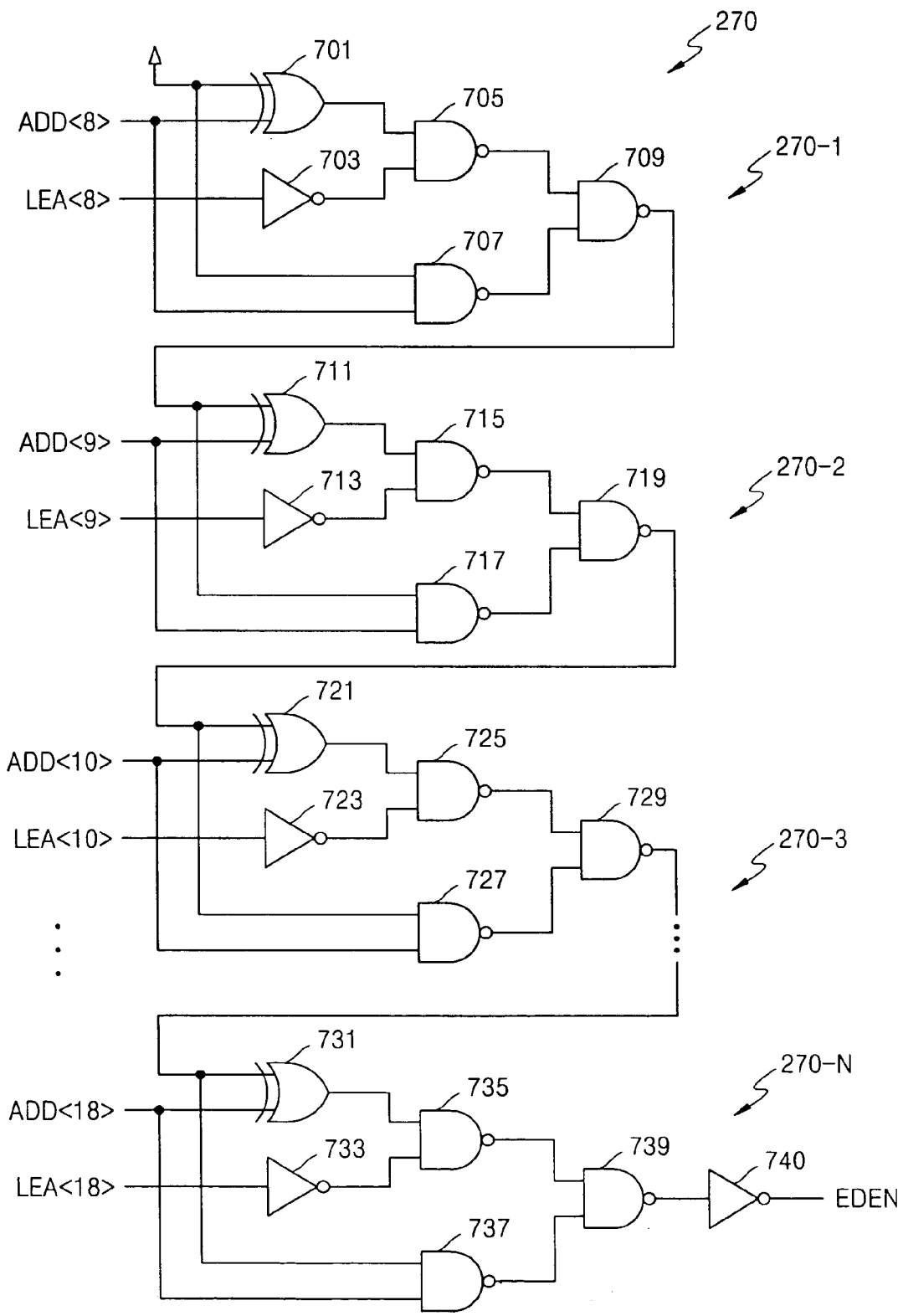
FIG. 9 is an electrical schematic of a second address comparator that may be used in the address compare circuit of FIG. 2.

An exemplary embodiment of the second address compare circuit 270 is illustrated as including a plurality of stages, which are shown as 270-1 through 270-N in FIG. 9. Each of these stages performs a bit-to-bit comparison between a latched end address bit and a corresponding bit of an applied address and also receives a result signal from a prior stage. The first stage 270-1 is illustrated as including an exclusive-OR logic gate 701, an inverter 703 and NAND gates 705, 707 and 709. The second stage 270-2 is illustrated as including an exclusive-OR logic gate 711, an inverter 713 and NAND gates 715, 717 and 719. The third stage 270-3 is illustrated as including an exclusive-OR logic gate 721, an inverter 723 and NAND gates 725, 727 and 729. The last stage 270-n is illustrated as including an exclusive-OR logic gate 731, an inverter 733, NAND gates 735, 737 and 739 and an output inverter 740 what converts an active low signal at an output of the NAND gate 739 to an active high end enable signal EDEN.

The start enable signal STEN and the end enable signal EDEN are provided to output logic that performs an AND operation. This output logic includes a 2-input NAND gate 280 and an inverter 290. Based on this configuration of the output logic, the simultaneous assertion of an active high start enable signal STEN and an active high end enable signal EDEN results in the generation of an active high unlock signal ULK_i. The generation of an active high unlock signal ULK_i to a corresponding primary control circuit (170-1 or 170-2) operates to identify the supplied row address ADD<17:8> as one that is within an unlocked area of the corresponding flash memory array (120-1 or 120-2).

Figure 3:
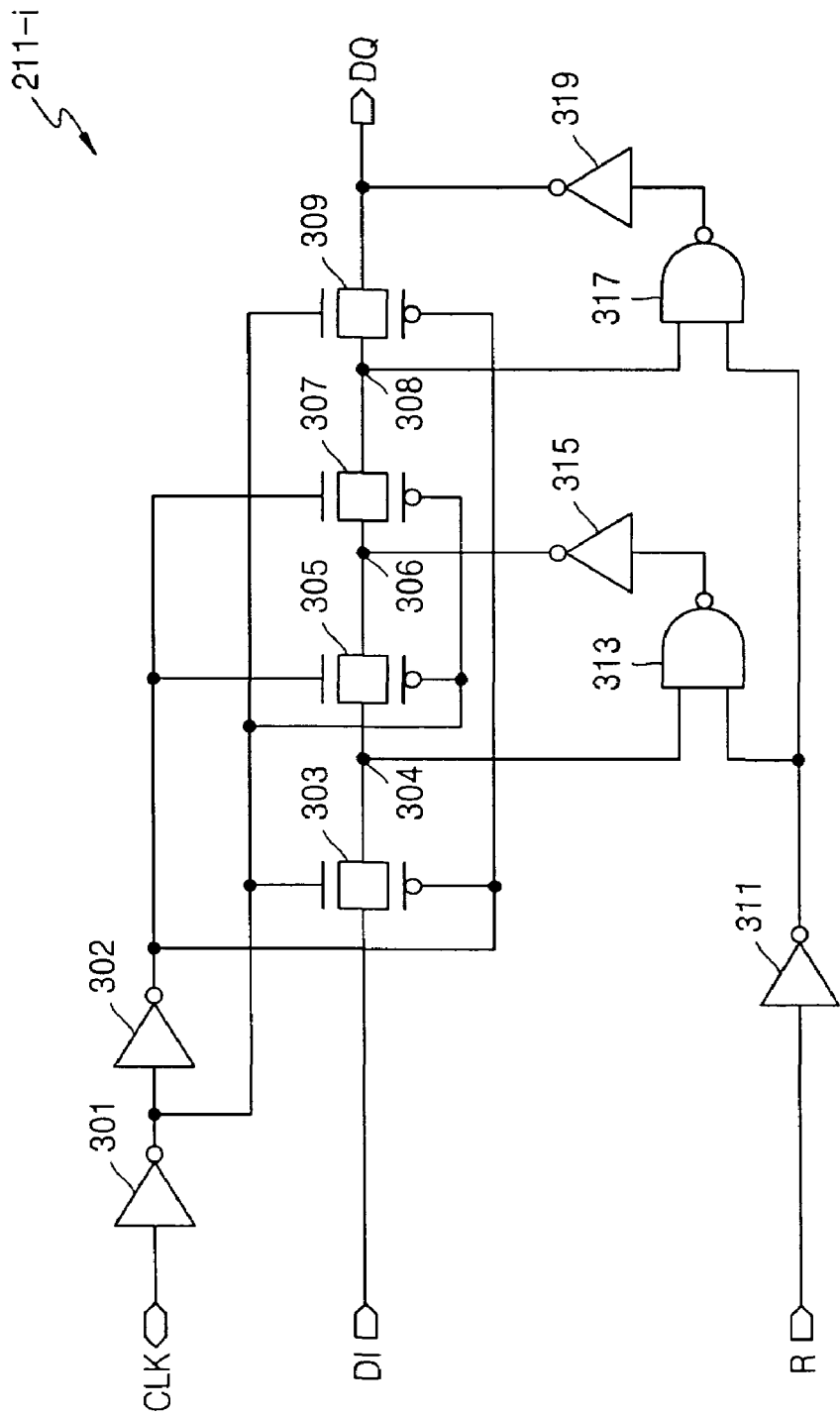
FIG. 3 is an electrical schematic of a D-type flip flop that may be used in the address compare circuit of FIG. 2.

Each of the D-type flip flops 211-i illustrated in FIG. 2 may be configured in a conventional manner or as illustrated by FIG. 3. In particular, each D-type flip-flop 211-i may be defined by a plurality of CMOS transmission gates 303, 305, 307 and 309. These transmission gates operate to sequentially pass a data input signal DI across a plurality of intermediate storage nodes 304, 306 and 308, to an output DQ. The CMOS transmission gates 303, 305, 307 and 309 are synchronized with a pair of clock signals that are generated by an inverter string, which is responsive to a clock signal CLK (e.g., STCLK or EDCLK in FIG. 2). This inverter string is illustrated as including a pair of inverters 301 and 302. The intermediate storage nodes and output DQ of the D-type flip-flop 211-*i* may be reset when the reset signal R (e.g., RESET in FIG. 2) is set to an active high level. The logic that is configured to reset the intermediate storage nodes and output DQ is illustrated as including inverters 311, 315 and 319 and NAND gates 313 and 317.

Figure 4:
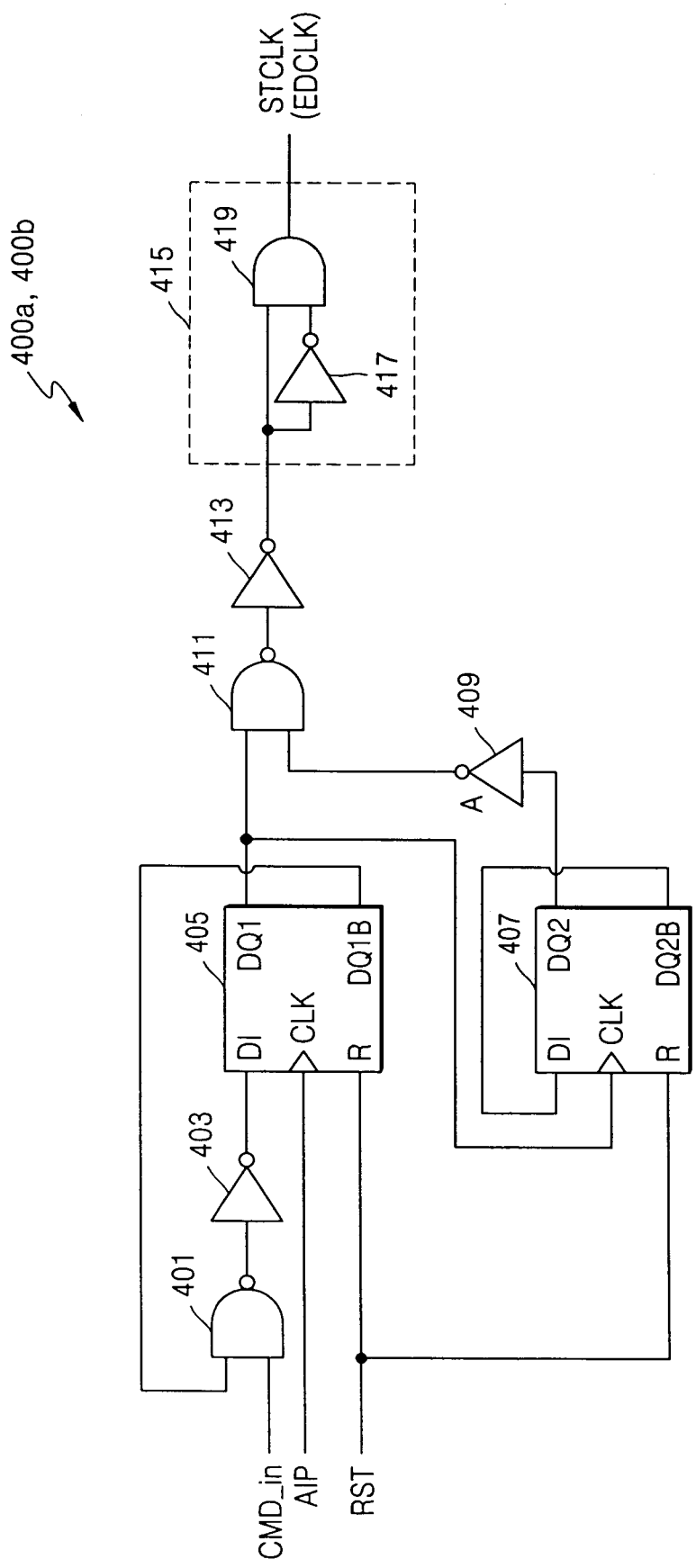
FIG. 4 is an electrical schematic of a clock generator that may be used in the primary control circuit of FIG. 1.

Each of the primary control circuits 170-1 and 170-2 includes a start clock generator 400a, which generates the start clock signal STCLK, and an end clock generator 400b, which generates the end clock signal EDCLK. These start and end clock signals STCLK and EDCLK are received by corresponding address compare circuits (160-1, 160-2), as described above with respect to FIG. 1. In FIG. 4, the start clock generator 400a and the end clock generator 400b are each responsive to a command input signal CMD_in, the address input pulse AIP and the reset signal RST. The address input pulse AIP and the reset signal RST are received by the corresponding primary control circuit 170-1 or 170-2, and the command input signal CMD_in is generated within each primary control circuit. The start clock generator 400a (and the end clock generator 400b) includes a pair of D-type flip-flops 405 and 407 that generate respective pairs of complementary output signals (shown as DQ1, DQ1B and DQ2, DQ2B) and collectively operate as a pulse counter. The data input DI of the first D-type flip-flop 405 receives a feedback signal derived from a first complementary output signal DQ1B and the command input signal CMD_in. The data input DI of the second D-type flip-flop 407 receives a feedback signal generated at a second complementary output DQ2B of the second D-type flip-flop 407. The clock input of the first D-type flip-flop 405 is responsive to the address input pulse AIP and the clock input of the second D-type flip-flop 407 is responsive to the true output DQ1 of the first D-type flip-flop 405. Boolean logic is also provided in the form of NAND gates 401, 411 and inverters 403, 409 and 413 and a pulse generator 415. The pulse generator 415, which includes inverter 417 and an AND gate 419, generates an active high clock pulse of relatively short duration whenever node A at the output of inverter 409 and the true output DQ1 of the first D-type flip-flop 405 are simultaneously set to logic 1 levels. This active high clock pulse represents either a start clock signal STCLK, which is generated by the start clock generator 400a, or an end clock signal EDCLK, which is generated by the end clock generator 400b.

Figure 5:
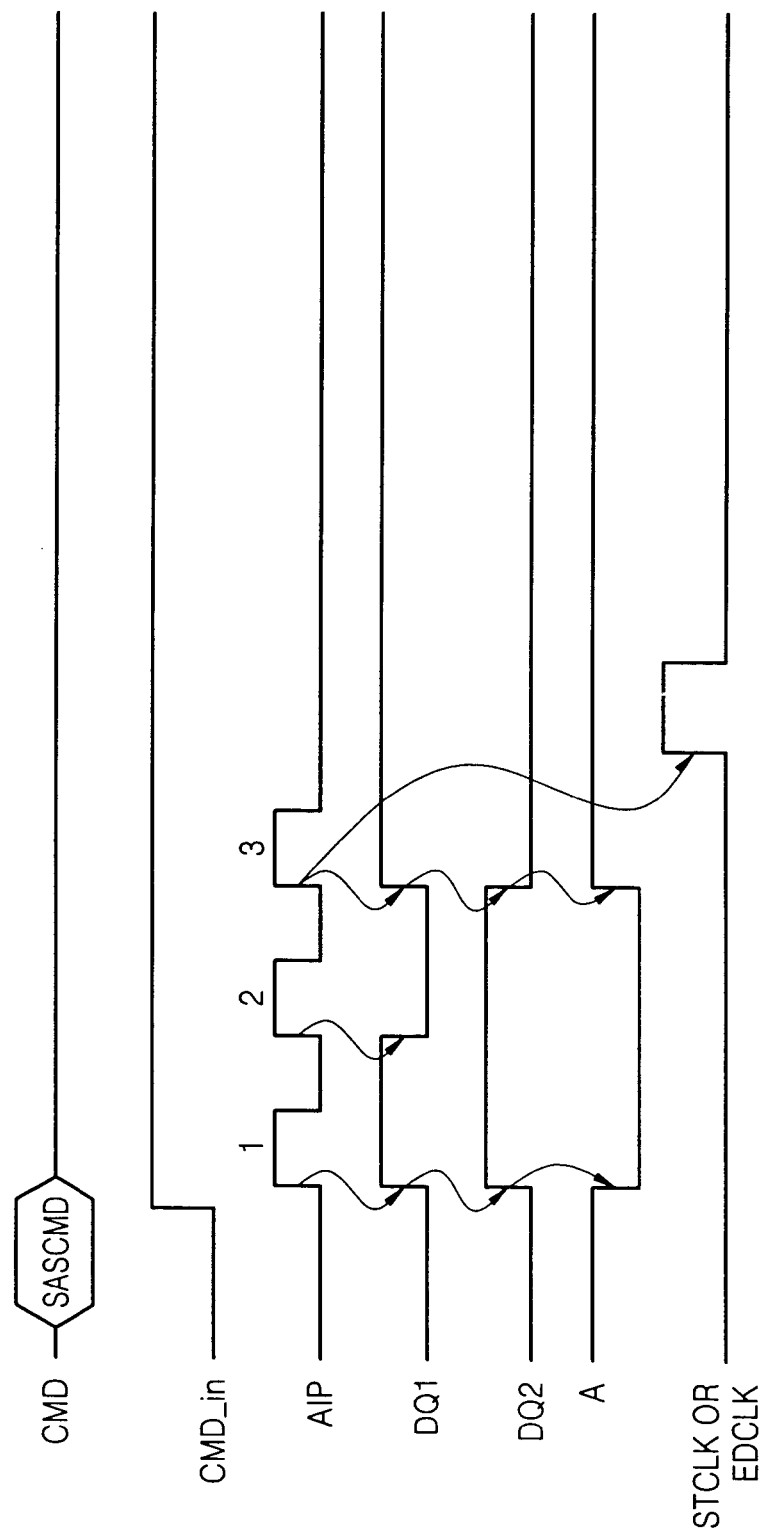
FIG. 5 is a timing diagram that illustrates operation of the clock generator of FIG. 4.

The operation of the start clock generator 400a and the end clock generator 400b will now be described more fully with reference to the timing diagram of FIG. 5. In particular, FIG. 5 illustrates the generation of an active high command input signal CMD_in in response to receipt of an address loading command (shown as SASCMD). The receipt of three consecutive address input pulses AIP during a period when the command input signal CMD_in is active at a high level results in the generation of a logic 1 level signal at an output A of the inverter 409 that overlaps with a logic 1 level signal at a true output DQ1 of the first D-type 405. When this occurs, the output of inverter 413 switches low-to-high and the pulse generator 415 generates a logic 1 pulse having a duration that equals a delay provided by the inverter 417.

Figure 6:
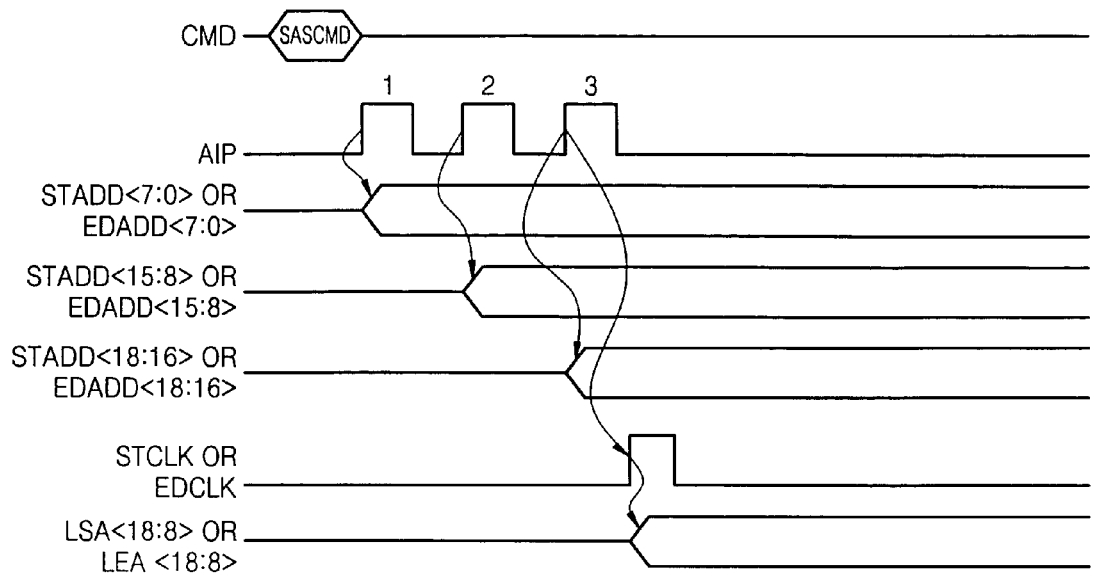
FIG. 6 is a timing diagram that illustrates operations to load a start address (STADD) and an end address (EDADD) into the address compare circuit of FIG. 2.

The generation of three consecutive address input pulses AIP under the conditions illustrated by FIG. 5 also synchronizes the loading of consecutive portions of the 19-bit address ADD<18:0> into a corresponding address register (not shown), which has an output electrically coupled to the address bus illustrated by FIG. 1. In particular, each address input pulse AIP may cause 8-bits of the corresponding 19-bit address to be loaded into the address register. Thus, as illustrated by the timing diagram of FIG. 6, the first address input pulse AIP may synchronize the loading of ADD<7:0>, the second address input pulse AIP may synchronize the loading of ADD<15:8> and the third address input pulse AIP may synchronize the loading of ADD<18:16>. These address bytes may correspond to a start address STADD that is loaded during a first series of three consecutive address input pulses AIP and an end address EDADD that is loaded during a second series of three consecutive address input pulses AIP. To maintain a reduced pin count in a packaged device, the three groups of address bits may be provided in sequence to eight I/O pins on a packaged device containing the first and second flash memory devices 110-1 and 110-2.

The first series of three consecutive address input pulses AIP causes the generation of a start clock signal STCLK as a logic 1 pulse, which operates to load the eleven most significant bits of the start address (i.e., STADD<18:8>, where STADD<17:8> maps to a row address within a flash memory array) into the start address register 210 of FIG. 2. A second series of three consecutive address input pulses AIP causes the generation of an end clock signal EDCLK as a logic 1 pulse, which operates to load the eleven most significant bits of the end address (i.e., EDADD<18:8>) into the end address register 250 of FIG. 2. These start address bits and end address bits are reflected at the outputs of the start and end address registers 210 and 250 as eleven bits of a latched start address LSA<18:8> and eleven bits of a latched end address LEA<18:8>.

Figure 7:
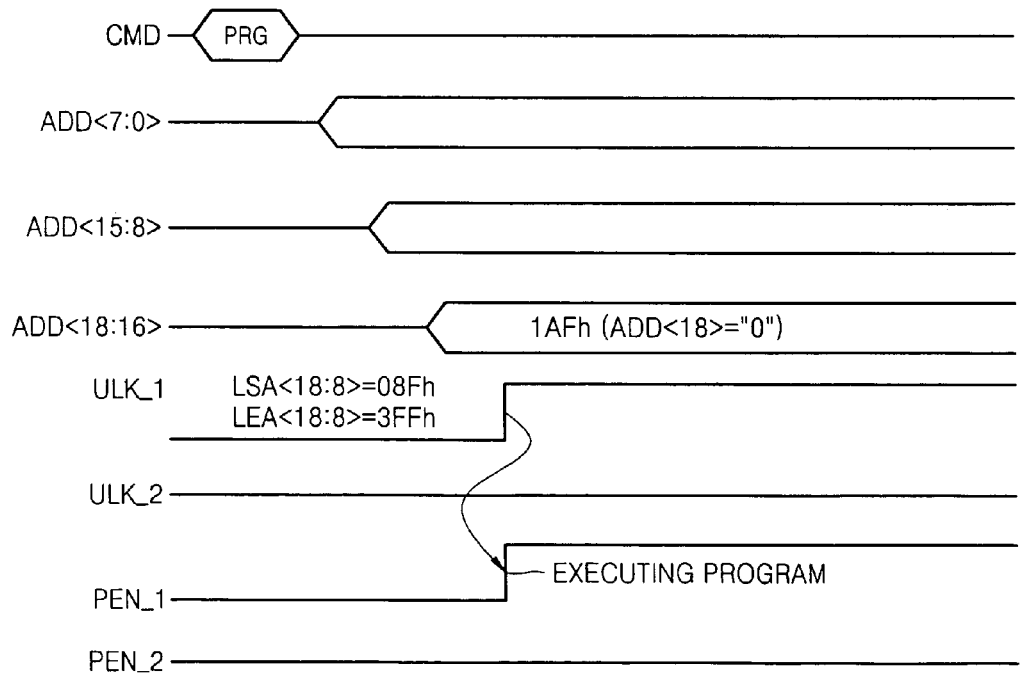
FIG. 7 is a timing diagram that illustrates operations to generate an unlock signal by the address compare circuit of FIG. 2 and operations to generate a program enable signal by the primary control circuit of FIG. 1.

Referring now to the address comparator 160-*i* of FIG. 2 and the timing diagram of FIG. 7, an example of how the application of a command and an address to the flash memory device system 100 results in a completion of the command if the address is within an unlocked area and a blocking of the command if the address is not within an unlocked area will be provided. In this example, a program command (PRG) is received by the flash memory device system 100 along with three consecutive address input pulses AIP. These pulses result in the loading of a full 19-bit address ADD<18:8> into the system 100, with ADD<18> operating as a chip select signal, ADD<17:8> operating as a row address and ADD<7:0> operating as a column segment address. A portion of this full address is provided to the first address comparator 160-1, which for purposes of this illustration retains a latched start address LSA<18:8> equal to 08Fh (i.e., 00010001111b) and a latched end address LEA<18:8> equal to 3FFh (i.e., 01111111111b).

The value of the chip select signal (i.e., ADD<18>) is shown as "0", which means the first flash memory device 110-1 (and not the second flash memory device 110-2) is being selected for the illustrated program operation. The eleven most significant bits of the supplied address (i.e., ADD<18:8>=1AFh=0011010101111b) are provided to the first address compare circuit 230 and the second address compare circuit 270 within the first address comparator 160-1. Because this supplied address is greater than the latched start address LSA<18:8>, the start enable signal STEN is generated at an active high level by the first address compare circuit 230. Moreover, because the supplied address is less than the latched end address LEA<18:8>, the end enable signal EDEN is generated at an active high level by the second address compare circuit 270. As illustrated by FIGS. 2 and 7, these two active high enable signals STEN and EDEN are received by boolean logic that performs an AND operation and generates an active high unlock signal ULK_1.

As illustrated by FIG. 1, this active high unlock signal ULK_1 is passed to the primary control circuit 170-1, which operates to generate an active high program enable signal PEN_1 that corresponds to the received command CMD (i.e., CMD=PRG). In contrast, because the value of the chip select signal operates to select the first flash memory device 110-1 and not the second flash memory device 110-2, the start enable signal STEN and the end enable signal EDEN are generated at inactive low levels within the address compare circuit 160-2. This results in the generation of an inactive unlock signal ULK_2, which operates to disable the primary control circuit 170-2 and thereby maintain the program enable signal PEN_2 at an inactive low level.

The generation of the program enable signal PEN_1 at an active high level operates to enable the program control circuit 152-1 and thereby result in the generation of an active high control signal CTL_1. This generation of the active high control signal CTL_1 enables the program operation to continue within the first flash memory array 120-1 at a row designated by the row address ADD<17:8>. Similar operations are also performed by the control circuit in response to an erase command. However, a read command, which can be performed from an unlocked area or a locked area within a flash memory array, does not require the selective generation of a corresponding enable signal by a primary control circuit.

Figure 10:
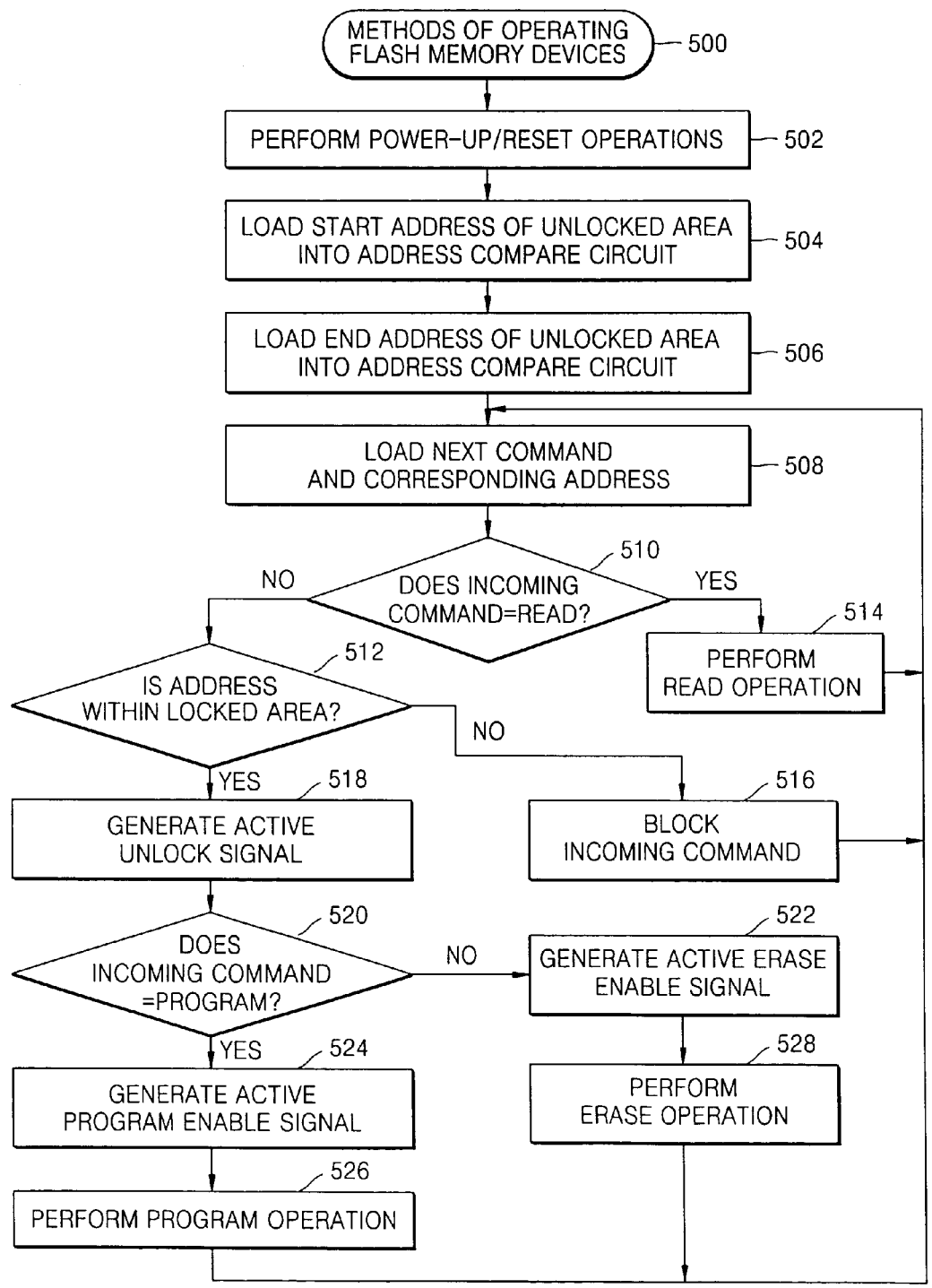
FIG. 10 is a flow diagram that illustrates operations performed by the flash memory device system of FIG. 1.

The above-described operations performed by the flash memory device system 100 are also illustrated by the flow-diagram of FIG. 10. In particular, FIG. 10 illustrates methods of operating flash memory devices 500 that include establishing an unlock area within a flash memory array during power-up and/or reset operations. As illustrated by Blocks 502, 504 and 506, each power-up and/or reset operation within a flash memory device may include establishing the boundaries of an unlock area within a flash memory array(s) by loading start and end addresses into an address compare circuit. Once the boundaries of the unlock area have been established, the flash memory device system may begin to perform normal program, erase and/or read operations in response to corresponding commands and addresses. The operations may include loading a next command (e.g., read, program (write) or erase) and corresponding address (e.g., chip select, row address and column address) into a flash memory device, Block 508. A check is then made at Block 510 to determine whether the received command is a read command. If so, conventional read operations may be performed, Block 514. Control is then returned to Block 508. However, if the received command is not a read command, then a check is made at Block 512 to determine whether the corresponding address associated with the command is within or without (i.e., outside) the boundaries of the unlock area within the corresponding flash memory array. If the address is outside the boundaries of the unlock area, then the incoming command (e.g, program or erase) is blocked, Block 516, and control is returned to Block 508. However, if the address is within the boundaries of the unlock area, an active unlock signal (e.g., ULK=1) is generated, Block 518. If the command is an erase command, then the active unlock signal results in the generation of an active erase enable signal (e.g., EEN=1) and the erase operation is performed at the designated address, Blocks 520, 522 and 528. Alternatively, if the command is a program command, then the active unlock signal results in the generation of an active program enable signal (e.g., PEN=1) and the program operation is performed at the designated address, Blocks 520, 524 and 526. After the program or erase operation as been performed, control is passed back to Block 508, where the next command and address are processed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A flash memory device, comprising:
an address compare circuit that is configured to indicate whether an applied row address associated with a first operation is within or without an unlock area of a flash memory array, said applied row address having a most significant bit that operates as a chip select signal that is received by said address compare circuit; and
a control circuit that is configured to block performance of the first operation on the flash memory array in response to detecting an indication from said address compare circuit that the applied row address is without the unlock area of the flash memory array.

2. The flash memory device of claim 1, wherein said address compare circuit comprises:
a start address register that is configured to latch an applied start row address in-sync with a start clock signal; and
an end address register that is configured to latch an applied end row address in-sync with an end clock signal.

3. The flash memory device of claim 2, wherein said address compare circuit further comprises:
a start address comparator that is configured to receive a latched start row address from said start address register; and
an end address comparator that is configured to receive a latched end row address from said end address register.

4. The flash memory device of claim 3, wherein said start address comparator comprises boolean logic that is configured to perform a comparison between the latched start row address and the applied row address; and wherein said end address comparator comprises boolean logic that is configured to perform a comparison between the latched end row address and the applied row address.

5. The flash memory device of claim 4, wherein said address comparator is configured to generate an unlock signal that indicates whether the applied row address associated with the first operation is within or without the unlock area of the flash memory array.

6. The flash memory device of claim 5, wherein said control circuit is responsive to the unlock signal.

7. The flash memory device of claim 1, wherein said control circuit comprises:
a first clock generator having a pulse counter therein that is configured to generate a start clock signal in response to receipt of a plurality of consecutive address input pulses.

8. The flash memory device of claim 7, further comprising a first address register that is configured to latch a start address of an unlock area in-sync with the start clock signal.

9. The flash memory device of claim 1, wherein said control circuit comprises:
a first clock generator that is configured to generate a start clock signal in response to receipt of at least one address input pulse.

10. A flash memory device, comprising:
a flash memory array;
a word line control circuit electrically coupled to word lines in said flash memory array and responsive to a command control signal;
a bit line control circuit electrically coupled to bit lines in said flash memory array and responsive to the command control signal;
an address compare circuit that is configured to indicate whether an applied row address associated with a command is within or without an unlock area of said flash memory array, by generating an unlock signal at an active level if the applied row address is within the unlock area or at an inactive level if the applied row address is without the unlock area;
a primary control circuit that is configured to generate a command enable signal in response to the command and the unlock signal; and
a command control circuit that is configured to generate the command control signal in response to the command enable signal.

11. The flash memory device of claim 10, wherein said primary control circuit is responsive to an address input pulse signal received at a pin of the flash memory device; and wherein the flash memory device is configured to latch first and second portions of the applied row address in-sync with first and second consecutive leading edges of the address input pulse signal.

12. The flash memory device of claim 10, wherein said primary control circuit is further configured to generate a comparator reset signal in response to a leading edge of a reset signal received by the flash memory device; and wherein said address compare circuit is responsive to the comparator reset signal.

13. The flash memory device of claim 10, wherein said address compare circuit comprises:
a start address register that is configured to latch an applied start row address in-sync with a start clock signal; and
an end address register that is configured to latch an applied end row address in-sync with an end clock signal.

14. The flash memory device of claim 13, wherein said address compare circuit further comprises:
a start address comparator that is configured to receive a latched start row address from said start address register and the applied row address; and
an end address comparator that is configured to receive a latched end row address from said end address register and the applied row address.

15. The flash memory device of claim 14, wherein said start address comparator comprises boolean logic that is configured to perform a comparison between the latched start row address and the applied row address; and wherein said end address comparator comprises boolean logic that is configured to perform a comparison between the latched end row address and the applied row address.

16. The flash memory device of claim 13, wherein said primary control circuit is further configured to generate the start clock signal in response to a first sequence of address input pulses and generate the end clock signal in response to a second sequence of address input pulses.

17. A method of operating a flash memory device, comprising the steps of:
loading at least first and second portions of a start address associated with an unlock area of a flash memory array into the flash memory device, in-sync with respective ones of a first plurality of consecutive address input pulses;
loading at least first and second portions of an end address associated with the unlock area into the flash memory device, in-sync with respective ones of a second plurality of consecutive address input pulses;
loading at least first and second portions of an applied address associated with an erase or program command into the flash memory device, in-sync with respective ones of a third plurality of consecutive address input pulses; and
comparing the applied address with the start and end addresses to determine whether the erase or program command is to be performed on the unlock area.

18. The method of claim 17, wherein said comparing step comprises evaluating whether the applied address is greater than or equal to the start address and evaluating whether the applied address is less than or equal to the end address.

19. The method of claim 17, wherein said comparing step comprises generating an unlock signal having a first level that enables performance of the erase or program command and a second level that blocks performance of the erase or program command.

20. A method of operating a flash memory device, comprising the steps of:
loading a start row address associated with an unlock area of a flash memory array into the flash memory device;
loading an end row address associated with the unlock area into the flash memory device;
loading an applied row address associated with an erase or program command into the flash memory device;
comparing the applied row address to the start row address to determine whether the applied row address is greater than or equal to the start row address;
comparing the applied row address to the end row address to determine whether the applied row address is less than or equal to the end row address; and
generating an unlock signal at an active level in response to determining that the applied row address is greater than or equal to the start row address and less than or equal to the end row address.

21. A flash memory system, comprising:
a first flash memory chip comprising:
a first flash memory array;
a first address compare circuit that is configured to indicate whether an applied address associated with a first operation is within or without an unlock area of the first flash memory array; and
a first control circuit that is configured to block performance of the first operation on the first flash memory array in response to detecting an indication from said first address compare circuit that the applied address is without the unlock area of the first flash memory array; and
a second flash memory chip comprising:
a second flash memory array;
a second address compare circuit that is configured to indicate whether the applied address associated with the first operation is within or without an unlock area of the second flash memory array; and
a second control circuit that is configured to block performance of the first operation on the second flash memory array in response to detecting an indication from said second address compare circuit that the applied address is without the unlock area of the second flash memory array.

22. The flash memory system of claim 21, wherein said first and second flash memory chips are mounted within a single integrated circuit package.

23. The flash memory system of claim 21, wherein said first and second control circuits are responsive to a most significant bit of the applied address.

24. The flash memory system of claim 23, wherein said first control circuit is selectively enabled when the most significant bit of the applied address equals a first logic value; and said second control circuit is selectively enabled when the most significant bit of the applied address equals a second logic value opposite the first logic value.

* * * * *